(12) United States Patent
Katahira

(10) Patent No.: US 6,455,932 B1
(45) Date of Patent: Sep. 24, 2002

(54) CERAMIC PACKAGE FOR SEMICONDUCTOR DEVICE

(75) Inventor: Yasushi Katahira, Yamagata (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/634,186

(22) Filed: Aug. 9, 2000

(30) Foreign Application Priority Data

Aug. 17, 1999 (JP) .......................................... 11-230452

(51) Int. Cl.⁷ ............................................... H01L 23/34
(52) U.S. Cl. ...................... 257/728; 257/729; 257/692; 257/698; 257/664; 257/693; 257/703; 257/701; 257/730
(58) Field of Search ................................ 257/728, 729, 257/730, 692, 698, 664, 691, 693

(56) References Cited

U.S. PATENT DOCUMENTS

| | | | |
|---|---|---|---|
| 4,698,661 A | * | 10/1987 | Bessonneau et al. ........... 357/74 |
| 4,908,694 A | * | 3/1990 | Hidaka et al. ................. 357/74 |
| 5,574,314 A | * | 11/1996 | Okada et al. ................. 257/728 |
| 5,852,391 A | * | 12/1998 | Watanabe et al. ........... 333/246 |
| 6,043,556 A | * | 3/2000 | Tomie ........................ 257/664 |

FOREIGN PATENT DOCUMENTS

| | | |
|---|---|---|
| JP | 60-210853 | 10/1985 |
| JP | 2-88242 | 7/1990 |
| JP | 10-112513 | 4/1998 |

* cited by examiner

Primary Examiner—Steven Loke
Assistant Examiner—Nitin Parekh
(74) Attorney, Agent, or Firm—Hutchins, Wheeler & Dittmar

(57) ABSTRACT

A semiconductor chip is mounted on a bottom plate, on which a side wall surrounding the semiconductor chip is formed. At a position where a lead passes through the side wall, an inner surface of the side wall and that of a ceramic piece lie on the same plane vertical to the bottom plate. Clearances with triangular cross-sections are provided for each boundary surface between the side wall and the ceramic piece so that the ceramic piece is prevented from being cracked by thermal stress. An airtight property of the ceramic package is not deteriorated by the aforementioned clearance.

11 Claims, 2 Drawing Sheets

CERAMIC PACKAGE FOR SEMICONDUCTOR DEVICE

FIELD OF THE INVENTION

The invention relates to a ceramic package for a semiconductor device, and especially to a ceramic package for a semiconductor device with a high output power used in a GHz band.

BACKGROUND OF THE INVENTION

Recently, a technology on a semiconductor device with high gain and high output power used in an extremely high frequency band, such as X or Ku band, makes remarkable progress. FIG. 1 shows a structure of a conventional ceramic package for a semiconductor device used in a GHz band. FIG. 2 is an enlarged diagram for showing Part A in FIG. 1. The conventional ceramic package for the semiconductor device is fabricated by processing a Cu plate serving as a heat sink, and provided with fitting portions 1a, 1b situated on both side ends thereof, a rectangular bottom plate 1c for mounting a semiconductor chip, such as a MOSFET (not shown), and a side wall 1d surrounding the bottom plate 1c. The fitting portions 1a, 1b are provided with dents 1e, 1f, through which fixing screws pass when the ceramic package is fixed to a substrate. The side wall 1d surrounds an inner space with a size of a'×b'.

As shown in FIG. 4, leads 3, 4 which are respectively connected with a gate and a drain of the FET by wire bonding pass through two sides of the side wall 1d, those being opposite to each other. A circular marking 2 for notifying that the lead 3 is connected with the gate is made on the fitting portion 1a. This marking is made as a dent formed by a press, a painted one by means of a paint-spraying alliance or a printed one by means of an ink jet printer.

As shown in FIGS. 1 and 2, the side wall 1d is provided with narrow width portions 5 which are respectively combined with dents 7 formed at backsides thereof. Ceramic pieces 6a, 6b are situated at a position where the lead 4 (or the lead 3) passes through the narrow width portion 5. A channel with a rectangular cross-section is formed at a bottom surface of the ceramic piece 6b. The lead 4 is fitted into the channel, supported by the ceramic pieces 6a, 6b, and fixed to and insulted from the side wall 1d by them. The ceramic pieces 6a, 6b are respectively formed by processing ceramic material into configurations shown in FIGS. 1 and 2. A length of the ceramic piece 6a is longer than a width of the side wall 1d, and an inner end of the same reaches the bottom plate 1c on the inside of the side wall 1d. On the other hand, a length of the ceramic piece 6b is the same as a width of the narrow width portion 5.

In the ceramic package shown in FIG. 1, a power MOSFET is mounted on the bottom plate 1c. A gate pad and a drain pad are respectively connected with the leads 3, 4 by means of wire bounding, and a source pad is connected with the bottom plate 1c serving as the ground to be fixed thereto. The space surrounded by the side wall 1d is charged with $N_2$ gas, and sealed with a cover (not shown) formed of Cu. In this way, the semiconductor device provided with the heat sink 1 for radiating heat is completed.

As mentioned in the above, since the conventional ceramic package for the semiconductor device reduces an area of a boundary surface for fixing ceramic to Cu by supporting the lead 4 (or the lead 3) by means of the ceramic pieces 6a, 6b fitted into the narrow width portion 5 provided for the side wall 1d, the ceramic pieces 6a, 6b are prevented from being cracked at the boundary surface for fixing ceramic to Cu even when stress caused by a difference in a thermal expansion coefficient between ceramic and Cu is applied to the ceramic pieces 6a, 6b, and the power MOSFET is kept to be sealed.

However, according to the conventional ceramic package for the semiconductor device, since the surface of a wall of the inner space having the bottom plate 1c as the base is remoter from a chip-mounting region than an internal end face of the ceramic piece 6a, the spatial distance a' of the inner space surrounded by the side wall 1d becomes long. As a result, a resonance frequency f of the inner space surrounded by the side wall 1d becomes low, wherein f is given as $$f=\{(1/a')^2+(1/b')^2\}^{1/2}\times 150.$$

If f becomes low, reflection losses in a higher frequency region (f=14.5 GHz) at input and output ports increase, and an isolation characteristic of the input port from the output port deteriorates.

The ceramic package with the structure shown in FIG. 1 is used in the X to Ku band. Hitherto, the saturation output level of the semiconductor device is about 10W, a small number, and in such a case, deterioration of the isolation characteristic of the input port does not matter. However, the semiconductor device with high output power and high gain is successively developed in recent years, and the improvement of the isolation characteristic of the input port of the ceramic package becomes indispensable.

SUMMARY OF THE INVENTION

Accordingly, it is an object of the invention to provide a ceramic package for a semiconductor device which prevents ceramic pieces from being cracked by thermal stress applied therto caused by difference in a thermal expansion coefficient between ceramic and Cu, and improves an isolation characteristic of an input port from an output port.

According to a feature of the invention, a ceramic package for a semiconductor device comprises:

a metallic bottom plate with predetermined dimensions, a semiconductor chip mounted on a central region of the metallic bottom plate, a metallic side wall squarely surrounding the semiconductor chip on the metallic bottom plate, and ceramic insulators fitted into openings formed on the metallic side wall and supporting leads to be connected with the semiconductor chip, wherein inner surfaces of the metallic side wall and those of the ceramic insulators respectively and approximately lie on same planes which are closet to the central region, and the ceramic insulators are respectively provided with clearances for relaxing thermal stress applied to the ceramic insulators at boundary surfaces between the ceramic insulators and the metallic side wall without deteriorating an airtight property of the ceramic package.

According to the aforementioned structure, since the inner surface of the metallic side wall and that of the ceramic insulator lie on the same plane vertical to the metallic bottom plate, the inner space of the metallic side wall surrounding the semiconductor chip is reduced, hence an spatial distance thereof is shortened. Accordingly, an resonance frequency is heightened depending on the spatial distance, and thereby an isolation characteristic of an input port from an output port is improved. Moreover, since the clearance is provided for the boundary surface between the ceramic insulator and the metallic side wall, the ceramic insulator is prevented from being cracked without deteriorating an airtight property of the ceramic package.

BRIEF DESCRIPTION OF THE DRAWINGS

The invention will be explained in more detail in conjunction with appended drawings, wherein.

DESCRIPTION OF THE PREFERRED EMBODIMENT

Thereafter, a preferred embodiment of the invention will be explained referring to the appended drawings.

Figure 3:
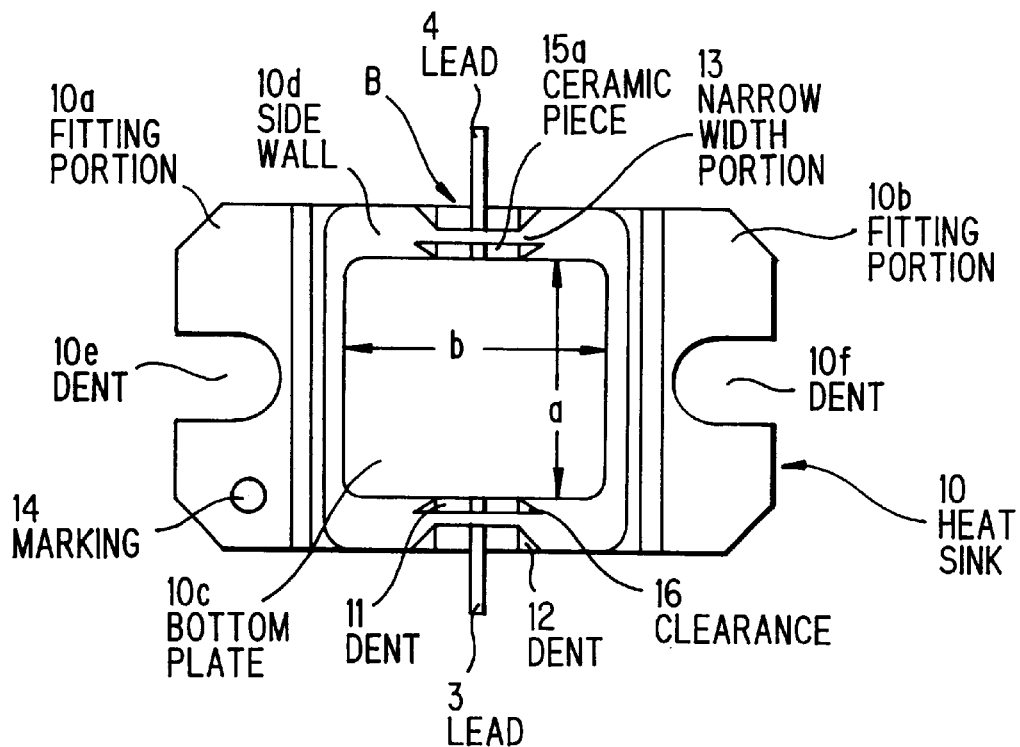
FIG. 3 is a plan view for showing a ceramic package for a semiconductor device according to the invention.
Figure 4:
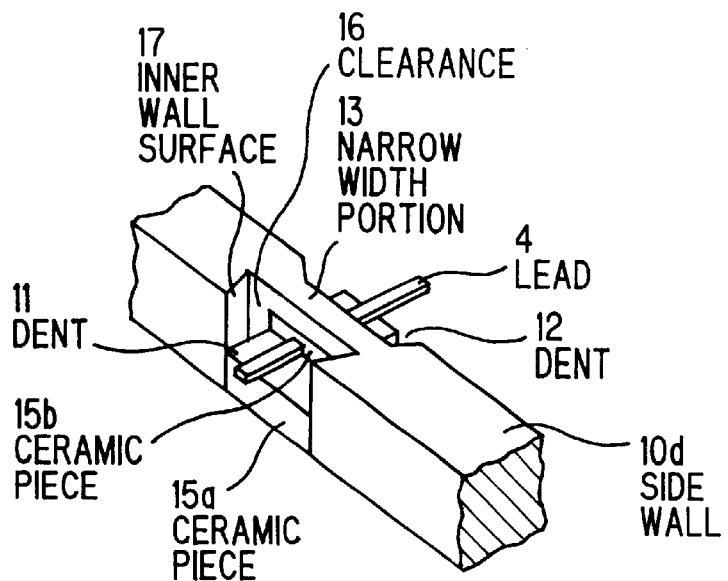
FIG. 4 is an enlarged perspective view for showing part B shown in FIG. 3 in detail.

FIG. 3 shows a ceramic package for a semiconductor device according to the invention. FIG. 4 is an enlarged diagram for showing Part B in FIG. 3. The ceramic package for the semiconductor device fabricated from a Cu plate serving as a heat sink is provided with fitting portions 10a, 10b at both the side ends thereof, and a bottom plate 10c mounting a semiconductor chip, such as a power MOSFET not shown), at a central part thereof. The bottom plate 10c is shaped into a rectangle with a size of a×b as shown in FIG. 3. A side wall 10d squarely surrounds the bottom plate 10c. At the both side ends of the ceramic package, the fitting portions 10a, 10b are respectively provided with U-shaped dents 10e, 10f, through which fixing screws pass when the ceramic package is fixed to a substrate. Leads 3, 4 pass through the side wall 10d along a bisector thereof, and run in parallel with the bottom plate 10c. A marking 14 is made near a lower end of the fitting portion 10a, and notifies an electrode of the power MOSFET to be connected with the lead 3.

Figure 1:
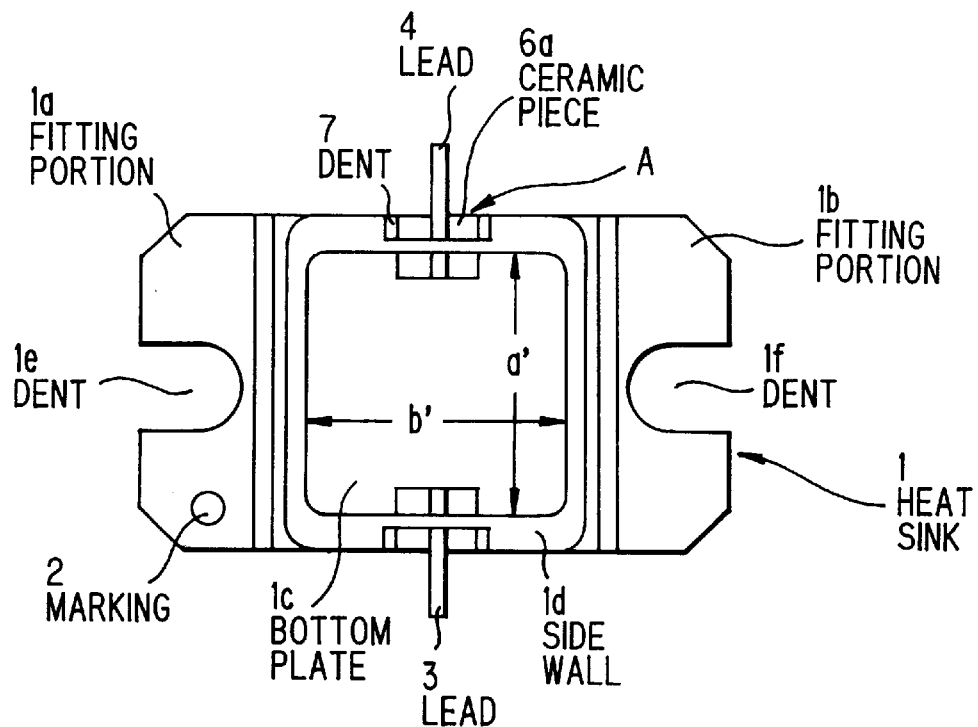
FIG. 1 is a plan view for showing a conventional ceramic package for a semiconductor device.
Figure 2:
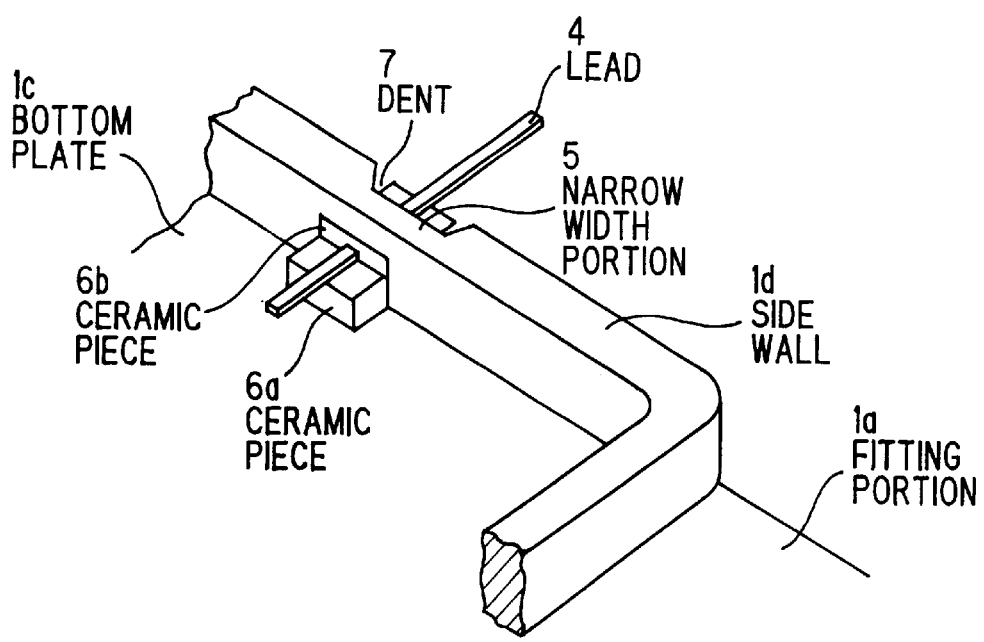
FIG. 2 is an enlarged perspective view for showing Part A shown in FIG. 1 in detail.

As shown in FIG. 4, at a part of the side wall 10d where the lead 4 (or the lead 3) passes through, the side wall 10d is provided with narrow width portions 13 which are respectively formed by the inside dents 11 and the outside dents 12. In this case, the lead 4 (or the lead 3) is inserted between ceramic pieces 15a, 15b. The cross-sectional view of the lead 4 (or the lead 3) is rectangular, a channel with a rectangular cross-section is formed at a bottom surface of the ceramic piece 15b, and the lead 4 (or the lead 3) is fitted into the aforementioned channel. The lead 4 (or the lead 3) is inserted between ceramic pieces 15a, 15b, and insulated from the side wall 10d by the same. The structures of the lead 4 and the ceramic pieces 15a, 15b, and the method for supporting the lead 4 by the ceramic pieces 15a, 15b are similar to those of the conventional ceramic package shown in FIGS. 1 and 2. At the aforementioned part where the lead 4 (or the lead 3) passes through the side wall 10d, an inner surface of the ceramic piece 15a and that of the side wall 10d lie on the same plane vertical to the bottom plate 10c. Similarly, an inner surface of the ceramic piece 15b and that of the narrow width portion 13 lie on the same plane vertical to the bottom plate 10c.

In case that the ceramic pieces 15a, 15b stick fast to an inner wall surface 17 of the inner dent 11 at a boundary surface therebetween, if thermal stress is exerted between the inner side wall 17 and the ceramic pieces 15a, 15b, there is a possibility that the ceramic pieces 15a, 15b are cracked. In order to prevent the ceramic pieces 15a, 15b from being cracked, a triangular clearance 16 is formed between the inner wall surface 17 and the ceramic pieces 15a, 15b. Explaining concretely, the clearance 16 is formed by shaping the inner wall surface 17 of the inner dent 11 so as not to be in parallel with the lead 4.

Next, a process of fabricating of the ceramic package shown in FIG. 3 will be explained. First, the power MOSFET is mounted on the central portion of the bottom plate 10c. Next, the gate of the power MOSFET is connected with the lead 3 and the drain of the same is connected with the lead 4 by means of wire bonding. Then, the source is connected with the bottom plate 10c to be grounded. Moreover, an inner space surrounded by the side wall 10d is charged with $N_2$ gas, and a cover (not shown) is fixed to the side wall 10d by means of adhesion or deposition. In this way, the semiconductor device according to the invention is completed.

As mentioned in the above, according to the preferred embodiment of the invention, the length a shown in FIG. 3 becomes shorter than the length a' in the connectional semiconductor device, so that a spatial distance of the ceramic package decreases according to the invention. Accordingly, a resonance frequency f determined by the inner space of the package becomes higher than a conventional one, wherein f is given by $$f=\{(1/a)^2+(1/b)^2\}^{1/2}\times 150,$$

hence the isolation characteristic of the input port from the output port in an operating frequency range (f=14.5 GHz) is improved. According to the experimental investigations conducted by the present inventors, the resonance frequency increases by about 2 GHz, and the isolation characteristic of the input port from the output port is improved by about 7% at the operating frequency (14.5 GHz).

As mentioned in the above, according to the ceramic package for the semiconductor device according to the invention, since the inner surface of the side wall and that of the ceramic piece lie in the same vertical plane, the internal spatial distance of the ceramic package can be reduced. As a result, the resonance frequency of the inner space of the package can be heightened, and thereby the isolation characteristic of the input port from the output port can be improved.

Although the invention has been described with respect to specific embodiment for complete and clear disclosure, the appended claims are not to be thus limited but are to be construed as embodying all modification and alternative constructions that may be occurred to one skilled in the art which fairly fall within the basic teaching here is set forth.

What is claimed is:

1. A ceramic package for a semiconductor device, comprising:

a metallic bottom plate with predetermined dimensions, a semiconductor chip mounted on a central region of said metallic bottom plate, a metallic side wall squarely surrounding said semiconductor chip on said metallic bottom plate, and ceramic insulators fitted into openings formed on said metallic side wall and supporting leads to be connected with said semiconductor chip, wherein portions of said inner surfaces of said metallic side wall disposed proximate to said ceramic insulators are respectively provided with clearances relative to said ceramic insulators that relax thermal stress applied to said ceramic insulators at boundary surfaces between said ceramic insulators and said metallic side wall without deteriorating an airtight property of said ceramic package.

2. A ceramic package for a semiconductor device according to claim 1, wherein:

said clearances are formed of a wall surface of a dent formed on said metallic side wall and a wall surface of said ceramic insulator so that a cross-sectional view of said clearance is substantially triangular.

3. A ceramic package for a semiconductor device according to claim 1, wherein:

said ceramic insulator includes a lower ceramic insulator having a width approximately equal to a width of said metallic side wall and an upper ceramic insulator having a width smaller than that of said metallic side wall, wherein said lead is inserted between said lower and upper ceramic insulators.

4. A ceramic package for a semiconductor device, comprising:

a bottom plate having a top planar surface;

a side wall surrounding said top planar surface of said bottom plate;

a first dent formed on an outer region of said side wall;

a second dent formed on an inner region of said side wall opposite to said first dent;

an opening formed through said side wall between said first and second dents; and a ceramic insulator carrying a conductor fitted into said opening of said side wall to provide a seal, wherein clearance spaces are formed between said ceramic insulator and portions of said side wall corresponding to said first and second dents.

5. A ceramic package for a semiconductor device according to claim 4, wherein said first dent formed on said outer region of said side wall portion has a substantially non-rectangular shape.

6. A ceramic package for a semiconductor device according to claim 5, wherein said second dent formed on said inner region of said side wall portion has a substantially non-rectangular shape.

7. A ceramic package for a semiconductor device according to claim 6, wherein said opening is substantially rectangular.

8. A ceramic package for a semiconductor device according to claim 4, wherein said ceramic insulator includes a lower portion and an upper portion, said upper portion having a groove that accepts the conductor, said groove being formed on a surface thereof that faces the lower portion of the ceramic insulator.

9. A ceramic package for a semiconductor device according to claim 8, wherein said lower portion of said ceramic insulator has a first width that is smaller than an upper width of said upper portion of said ceramic insulator.

10. A ceramic package for a semiconductor device according to claim 4, wherein said clearance spaces each have a substantially triangular shape.

11. A ceramic package for a semiconductor device according to claim 4, wherein said inner walls of said side walls formed by said first and second dents are substantially non-parallel to a longitudinal edge of said ceramic insulator.

* * * * *